United States Patent
Fan et al.

(10) Patent No.: US 9,628,894 B2
(45) Date of Patent: Apr. 18, 2017

(54) AUDIO ENTERTAINMENT SYSTEM FOR A VEHICLE

(71) Applicant: GM GLOBAL TECHNOLOGY OPERATIONS LLC, Detroit, MI (US)

(72) Inventors: Yue Fan, Ann Arbor, MI (US); John C. Lyons, Detroit, MI (US); Karen Juzswik, Ypsilanti, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 34 days.

(21) Appl. No.: 14/824,956

(22) Filed: Aug. 12, 2015

(65) Prior Publication Data

US 2017/0048606 A1 Feb. 16, 2017

(51) Int. Cl.
*H04R 5/02* (2006.01)
*H04R 3/00* (2006.01)
(Continued)

(52) U.S. Cl.
CPC ........... *H04R 1/1041* (2013.01); *H03F 3/181* (2013.01); *H04R 1/323* (2013.01); *H04R 3/04* (2013.01); *H04R 3/12* (2013.01); *H04R 5/02* (2013.01); *H04S 7/30* (2013.01); *H03F 2200/03* (2013.01); *H04R 2499/13* (2013.01); *H04S 2400/03* (2013.01)

(58) Field of Classification Search
CPC ........ H04R 2499/13; H04R 5/02; H04R 5/04; H04R 2420/01; H04R 2420/03; H04R 2420/07; H04R 3/04; H04R 3/12; H04R 29/00; H04R 1/403; H04R 1/1041; H04R 1/1083; H04R 1/1091; H04R 2430/01; H04R 27/00; G06F 3/165; H04B 1/082; H04B 1/207; H04S 2400/13; H04S 7/30
See application file for complete search history.

(56) References Cited

U.S. PATENT DOCUMENTS

| 3,397,286 A | 8/1968 | Prewitt et al. |
| 5,108,335 A * | 4/1992 | Carey ............... H04B 1/20 381/86 |

(Continued)

FOREIGN PATENT DOCUMENTS

EP 0782369 7/1997

*Primary Examiner* — Thang Tran
(74) *Attorney, Agent, or Firm* — Dierker & Kavanaugh, P.C.

(57) ABSTRACT

An audio entertainment system for a vehicle includes a primary audio entertainment source to play a primary audio program and a secondary audio entertainment source to play a secondary audio program. The system has a plurality of front speakers, a left rear speaker, and a right rear speaker. A headphone set is for private listening by a rear seat passenger to the secondary audio program. The headphone set is selectably connectable to the secondary audio entertainment source. The system has a normal mode and a selectable enhanced rear seat entertainment mode. In the enhanced mode, an output sound power frequency spectrum of the rear speakers is automatically adjustable by frequency band to reduce audible interference between the primary program and the secondary program as audibly detected by the rear seat passenger while minimizing a disturbance to the primary audio program audibly detectable at the front seat row.

17 Claims, 5 Drawing Sheets

(51) Int. Cl.
*H04R 1/10* (2006.01)
*H04R 3/04* (2006.01)
*H04R 3/12* (2006.01)
*H04R 1/32* (2006.01)
*H03F 3/181* (2006.01)
*H04S 7/00* (2006.01)

(56) References Cited

U.S. PATENT DOCUMENTS

| | | | |
|---|---|---|---|
| 5,661,811 A * | 8/1997 | Huemann | H04R 5/04 381/309 |
| 6,950,525 B2 | 9/2005 | Harrell et al. | |
| 7,742,610 B1 * | 6/2010 | Hibino | H04R 5/04 381/102 |
| 8,031,880 B2 | 10/2011 | Holmi et al. | |
| 2003/0053638 A1 * | 3/2003 | Yasuhara | H04R 5/04 381/86 |
| 2003/0060954 A1 * | 3/2003 | Kobata | H04B 1/20 701/36 |
| 2003/0103634 A1 * | 6/2003 | Ito | H04B 1/082 381/86 |
| 2005/0032500 A1 * | 2/2005 | Nashif | H04R 5/02 455/345 |
| 2014/0093107 A1 | 4/2014 | Vu et al. | |

* cited by examiner

| 64 | 65 |
|---|---|
| 20-40 | 70 |
| 40-80 | 71 |
| 80-160 | 72 |
| 160-320 | 73 |
| 320-640 | 74 |
| 640-1280 | 75 |
| 1280-2560 | 76 |
| 2560-5120 | 77 |
| 5120-10200 | 78 |
| 10200-20400 | 79 |

AUDIO ENTERTAINMENT SYSTEM FOR A VEHICLE

BACKGROUND

Some existing audio entertainment systems available for use in vehicles provide a primary audio program audible to occupants via loudspeakers. Headphones may be used to allow passengers to privately listen to a secondary audio program. For example, a driver and front seat passenger may listen to a radio program while a rear seat passenger watches a video on a video display and listens to the corresponding audio via headphones. The primary audio program may audibly interfere with the secondary audio program as perceived by the headphone-wearing passenger. Such interference may diminish the headphone-wearing passenger's enjoyment of the secondary audio program.

SUMMARY

An audio entertainment system for a vehicle includes a primary audio entertainment source to play a primary audio program and a secondary audio entertainment source to play a secondary audio program. The system has a plurality of front speakers, a left rear speaker, and a right rear speaker. A headphone set is for private listening by a rear seat passenger to the secondary audio program. The headphone set is selectably connectable to the secondary audio entertainment source. The audio entertainment system has a normal mode and a selectable enhanced rear seat entertainment mode. In the enhanced rear seat entertainment mode, an output sound power frequency spectrum of the rear speakers is automatically adjustable by frequency band to reduce audible interference between the primary program and the secondary program as audibly detected by the rear seat passenger while minimizing a disturbance to the primary audio program audibly detectable at the front seat row.

BRIEF DESCRIPTION OF THE DRAWINGS

Features of examples of the present disclosure will become apparent by reference to the following detailed description and drawings, in which like reference numerals correspond to similar, though perhaps not identical, components. For the sake of brevity, reference numerals or features having a previously described function may or may not be described in connection with other drawings in which they appear.

DETAILED DESCRIPTION

Audio entertainment systems may have a plurality of loudspeakers. A typical automotive audio system may have loudspeakers at four corners of the passenger compartment. For example, an automotive audio system may have a left front loudspeaker, a right front loudspeaker, a left rear loudspeaker and a right rear loudspeaker. The volume of each of the loudspeakers may be adjusted using balance and fade controls to optimize the aural image of an audio program in psychoacoustic space. With stereo audio, the sound that comes out of the left loudspeakers (e.g., the left front loudspeaker and the left rear loudspeaker) may differ from the sound that comes out of the right loudspeakers (e.g., the right front loudspeaker and the right rear loudspeaker) in amplitude and timing. The shape and location of human ears on the human head allow the listener to not only perceive the sound, but to determine a location of the sound emitter. As such, a healthy child having reached certain developmental milestones may turn her head to look at a person that speaks the child's name.

Figure 1:
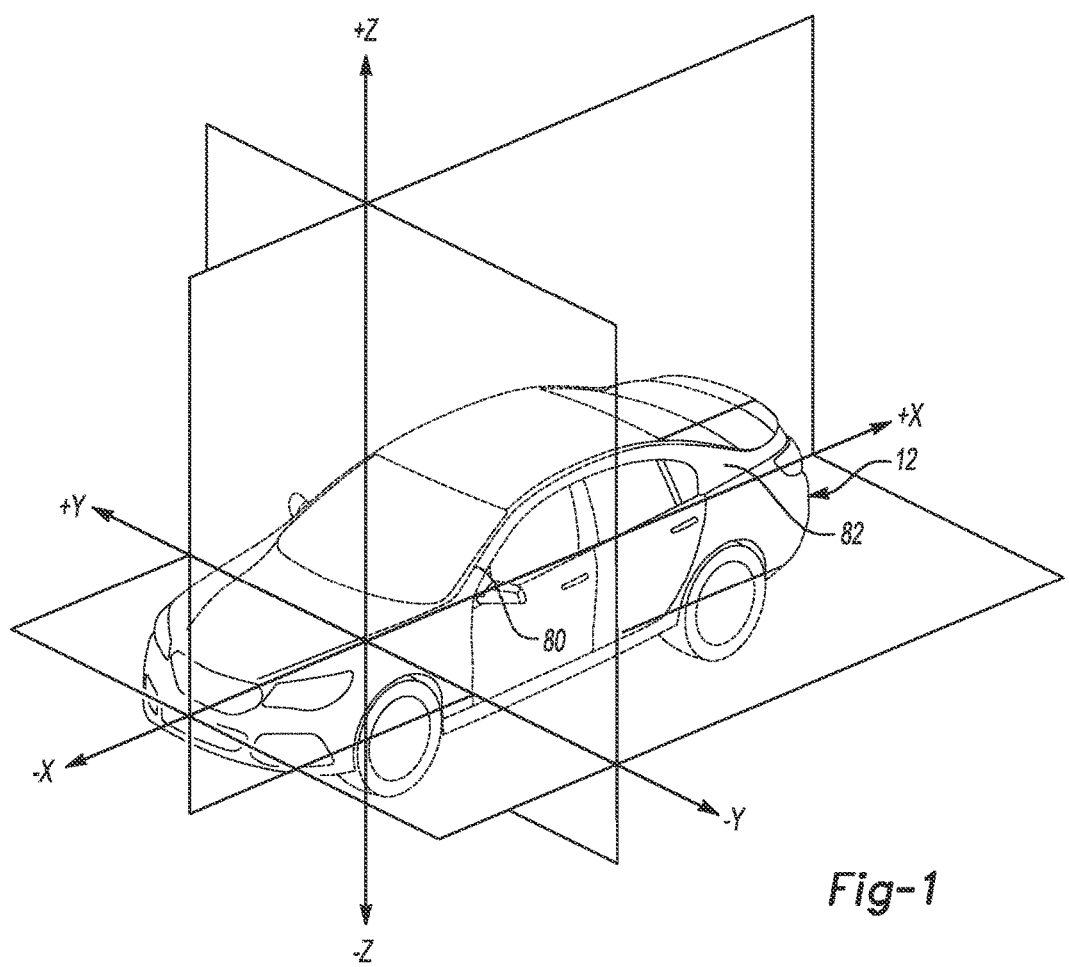
FIG. 1 is a coordinate system diagram depicting an example of vehicle space.

As used herein, "left" means in the negative "Y" direction as depicted in FIG. 1. FIG. 1 depicts a similar coordinate system to the coordinate system depicted in SAE J182, "Motor Vehicle Fiducial Marks and Three-dimensional Reference System", reaffirmed April 2005, FIG. 1. Using the same coordinate system, "right" means in the positive "Y" direction as depicted in FIG. 1. "Forward" means in the negative X direction as depicted in FIG. 1; and "aft" or "rearward" means in the positive "X" direction as depicted in FIG. 1.

A loudspeaker is an electroacoustic transducer to convert an electrical audio signal into a corresponding sound. The term "loudspeaker" may refer to individual transducers (known as "drivers") or to complete speaker systems consisting of an enclosure including one or more drivers. To adequately reproduce a wide range of frequencies with even coverage, loudspeaker systems may have more than one driver. Individual drivers in the loudspeaker system may be to reproduce different frequency ranges. A driver configured for very low frequencies may be known as a subwoofer. A woofer reproduces low frequencies; a mid-range driver reproduces middle frequencies; tweeters reproduce high frequencies; and supertweeters may be used for the highest audible frequencies. A two-way loudspeaker system may have a woofer and a tweeter without a mid-range driver. When multiple drivers are used in a loudspeaker system, a "filter network", called a crossover, separates the incoming signal into signals having different frequency ranges and routes the signals to the appropriate driver. A loudspeaker system with n separate frequency bands is described as having "n-way speakers". A two-way system will have a woofer and a tweeter; a three-way system employs a woofer, a mid-range, and a tweeter. As used herein, a loudspeaker is distinguished from a headphone. A headphone is for private listening, and may be in contact with at least one, but normally two ears of the listener. Although sound emitted from a headphone may be detectable by people nearby, headphones are not for listening at a distance. Loudspeakers are for listening at a distance. Loudspeakers may be heard, for example, by anyone with normal hearing in the passenger compartment of a vehicle. Therefore, a headphone is not a loudspeaker in the context of the present disclosure, and a loudspeaker is not a headphone. Further, as used herein, the term "speaker" may be used interchangeably with "loudspeaker" and have the same meaning unless specifically stated otherwise for a particular instance herein.

In some vehicles, the passengers may not agree regarding the entertainment value of certain audio programs. Such disagreement may be at least partially resolved by having the driver and passengers in the first row of seats listen to a first audio program via loudspeakers mounted in the vehicle, while other passengers listen to a second audio program via headphones. Unfortunately, the disagreement may not be completely resolved by resorting to headphones because sound from the first audio program playing on the loudspeakers can penetrate the headphones and acoustically interfere with sound from the second audio program playing on the headphones.

Figure 2A:
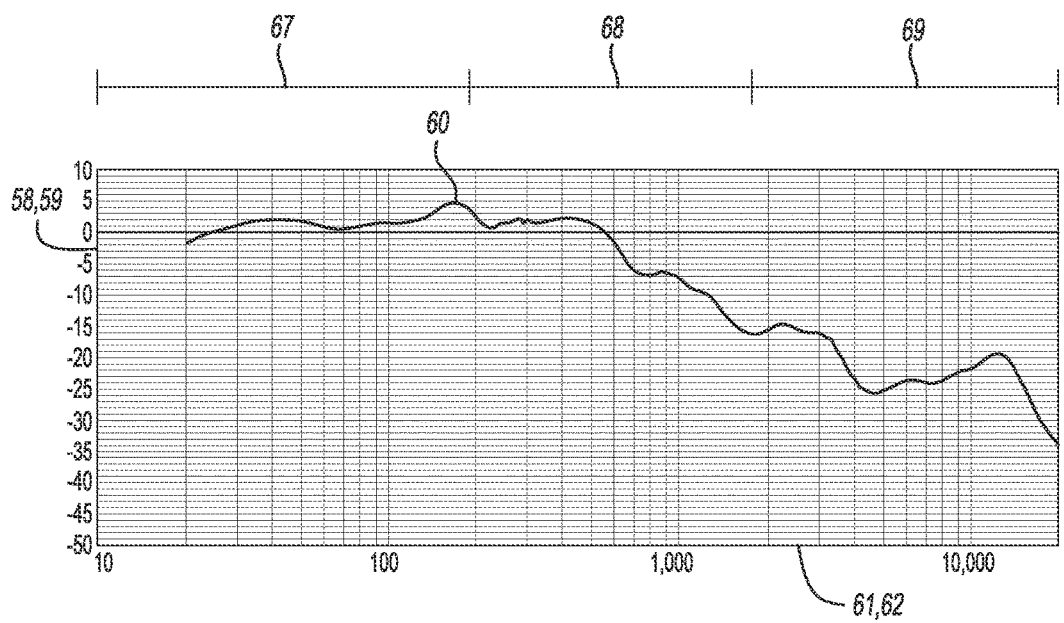
FIG. 2A is an isolation frequency diagram for a headphone set.

The ability of sound produced external to headphones to penetrate the headphones is related to isolation capabilities of the headphones. Isolation is a form of sound insulation. FIG. 2A is an isolation frequency diagram for an example of a headphone set 40. In FIG. 2A, attenuation 58 is depicted on the ordinate axis 59 in dB (decibels) and frequency 61 is on the abscissa 62 shown with a logarithmic scale in units of Hz (hertz). If the headphone set 40 related to FIG. 2A were turned off, the headphone attenuation of the sound heard by the person wearing the headphone set 40 is depicted by the headphone attenuation curve 60. As such, −20 dB means that the amplitude of the sound penetrating the headphone set 40 to the ear of the listener has been reduced by a factor of 10. FIG. 2A depicts the frequency domain divided into bass 67, midrange 68, and treble bands 69. The headphone set 40 associated with FIG. 2A amplifies exterior sound a by a small amount in the bass 67 and part of the midrange 68 frequency bands; however, in the treble band 69 frequencies are attenuated.

Figures 2B, 3:
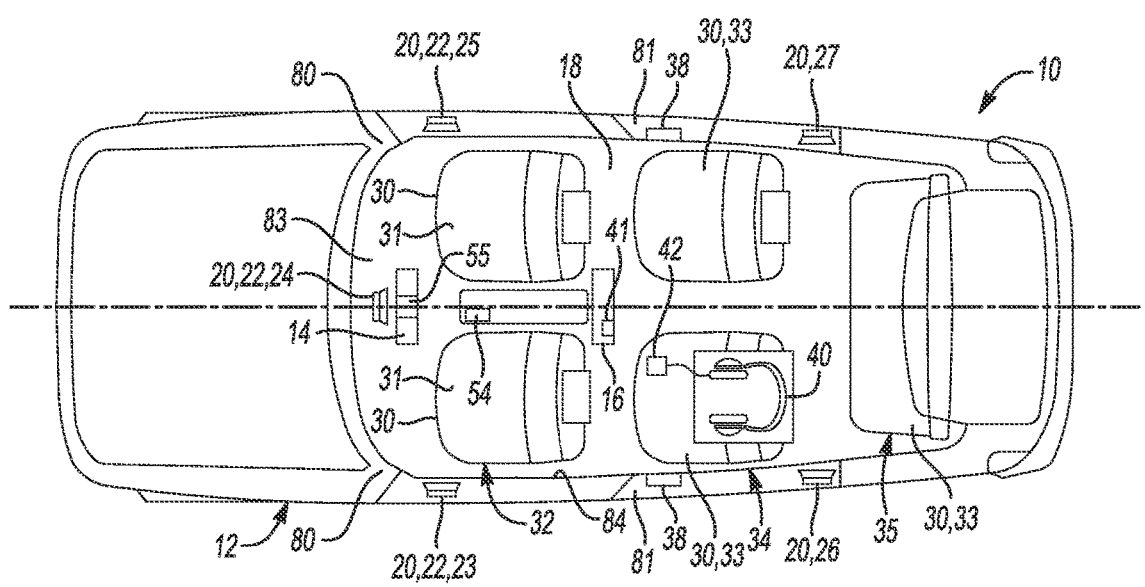
FIG. 2B is a table depicting frequency ranges associated with frequency bands.
FIG. 3 is a semi-schematic overhead view depicting an example of an audio entertainment system for a vehicle according to the present disclosure.
Figure 4:
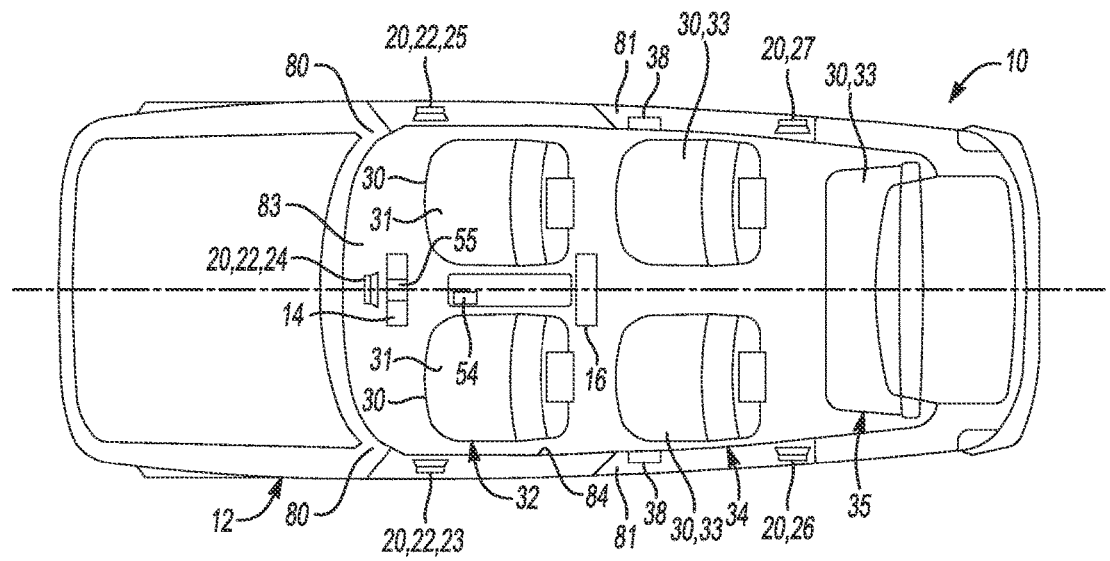
FIG. 4 is a semi-schematic overhead view depicting the example of the audio entertainment system for a vehicle depicted in FIG. 3 except no headphones are connected according to the present disclosure.

FIG. 2B shows frequency ranges 64 in Hz that may be associated with a frequency band 65 name: Low Bass 70, 20-40 Hz; Mid Bass 71, 40-80 Hz; Upper Bass 72, 80-160 Hz; Lower Midrange 73, 160-320 Hz; Middle Midrange 74, 320-640 Hz; Upper Midrange 75, 640-1280 Hz; Lower Treble 76, 1280-2560 Hz; Middle Treble 77, 2560-5120 Hz; Upper Treble 78, 5120-10200 Hz; Top Octave 79, 10200-20400 Hz. The frequency bands depicted in FIG. 2A are approximate, and do not align exactly with the frequency bands in FIG. 2B. For example, the Lower Midrange 73 may be from about 160 Hz to about 320 Hz.

In an attempt to resolve the disagreement over the entertainment value of certain audio programs, the fader and balance controls of the audio system may be manually manipulated to reduce the volume of the first audio program emitted from speakers closest to the headphones. In an attempt to accommodate the headphone-wearing passenger, balance and fade controls may be used to adjust the output of the loudspeakers. For example, the output of the speaker system may be biased away from the headphone-wearing passenger.

Some existing audio systems provide a switch to eliminate the output of certain speakers. The switch may be located close to the left rear speaker or the right rear speaker, for easy manipulation by a passenger seated near the left rear speaker or the right rear speaker. The switch may also be located for convenient access by the driver. Reducing the volume of the first audio program playing on the rear speaker may resolve dissatisfaction of the headphone-wearing passenger with the first audio program, however, the driver and passengers seated in the front row may have their enjoyment of the primary audio program reduced because the aural image of an audio program in psychoacoustic space may have been shifted too much from an optimal location in the psychoacoustic space. Further, if the switch opens the circuits leading to the left rear speaker or the right rear speaker, automatic fault detection circuitry may be triggered to falsely indicate a failure in the circuitry of the left rear speaker or the right rear speaker. Still further, if the left rear speaker or the right rear speaker is inadvertently left with an open circuit by using a switch mounted behind the first row of seats, it may be inconvenient for the driver to reset the system to allow all of the loudspeakers to achieve full volume.

FIG. 3 is a semi-schematic overhead view depicting an example of a vehicle 12, and an audio entertainment system 10 for the vehicle 12 according to the present disclosure. In examples of the present disclosure, an audio entertainment system 10 for the vehicle 12 includes a primary audio entertainment source 14 to play a primary audio program and a secondary audio entertainment source 16 to play a secondary audio program different from the primary audio program. In an example, the primary entertainment source may be a radio receiver to receive and play AM (Amplitude Modulated), FM (Frequency Modulated), or XM (Satellite) radio broadcasts. The primary entertainment source may be a cassette tape player, a CD (compact disc) player, an MP3 player, DVD player, streaming video player or other device for playing audio entertainment content. Audio entertainment content may be an audio portion of an audio/video presentation, e.g., the sound associated with a DVD movie. Audio entertainment content may be music, spoken or singing voices, or other sounds to be played through speakers 20 of the vehicle 12.

In examples of the present disclosure, the vehicle 12 may have an audio entertainment system 10 further including a plurality of front speakers 22. The front speakers 22 are located in the passenger compartment 18 of the vehicle 12 between an A-pillar 80 and a B-pillar 81 of the vehicle 12. In examples that do not have a B-pillar 81, the front speakers 22 are located in front of or to the left or right of, but not aft of, a base 31 of a seat 30 in the front seat row 32 of the vehicle 12 when the seat 30 is adjusted to its rearmost position. In examples of the present disclosure, front speakers 22 may be mounted in the instrument panel 83, on the A-pillar 80, in the front door panel 84, or anywhere forward of the ears of a person sitting in a seat 30 in the front seat row 32. The front speakers 22 shown in FIG. 3 include a left front speaker 23, a center front speaker 24, and a right front speaker 25. In examples, the center front speaker 24 may be omitted.

Pillars are used in vehicles 12 to provide support between a lower body portion 85 and a roof portion 86 of the vehicle 12 (see FIG. 1). A quantity of pillars may depend on the shape, size, and body style of the vehicle (e.g., coupe, sedan, wagon, etc.). A sedan is a vehicle with a body that has 3 compartments, (engine, passenger, cargo), two rows of seats, and 3 pillars on each side of the vehicle. Pillars may be given alphabetical letter designations in order from the front to the rear of the vehicle 12 while viewing the vehicle in profile.

Typically, a pillar at the front of the passenger compartment is designated an "A-pillar" 80. A pillar between the doors of a sedan would be a "B-pillar" 81, and the pillar in the back of the passenger compartment would be a "C-pillar" 82. Pillars are implied where there is a break between doors or glass, even if there is no vertical support at the break. As such, in some vehicle body styles, a pillar may be skipped. For example, some coupes may not have a B-pillar, but the rearmost pillar is designated the "C-pillar". In some vehicles with 3 or more doors on a side, the additional pillars between the doors would be designated "B1", "B2", etc.

In examples of the present disclosure, the audio entertainment system 10 further includes a left rear speaker 26 located aft and to the left of a front seat row 32. A right rear speaker 27 is located aft and to the right of the front seat row 32. A headphone set 40 is for private listening by a rear seat 33 passenger to the secondary audio program. As used herein, "rear seat" means a seat 30 in a row other than the front seat row 32. For example, seats 30 in a second seat row 34 or a third seat row 35 as depicted in FIG. 3 are rear seats 33. "Rear seat passenger", as used herein, means a passenger that occupies a rear seat 33. A passenger that occupies a booster seat, infant carrier, or child restraint system affixed to, or disposed upon, a rear seat 33 is also considered herein to be a rear seat passenger.

The headphone set 40 is selectably connectable to the secondary audio entertainment source 16. In an example, the headphone set 40 may be connectable to the secondary audio entertainment source 16 by plugging a headphone plug 42 electrically connected to the headphone set 40 into an audio jack 41 selectably electrically connectable to the secondary audio entertainment source. In an example, the headphone plug 42 may be a 3.5 mm "mini" connector, and the audio jack 41 may be a 3.5 mm audio jack. In the example shown in FIG. 7, contacts of the headphone plug 42 are assigned as follows: Tip 96, speaker on the right side 47 of the headphone set 40; first ring 97, speaker on the left side 46 of the headphone set 40; sleeve 98, ground. Other arrangements/assignments of contacts on the headphone plug 42 are also disclosed herein.

In examples of the present disclosure, the audio entertainment system 10 has a normal operating mode and a selectable enhanced rear seat entertainment operating mode. In the enhanced rear seat entertainment operating mode, an output sound power frequency spectrum of the rear speakers 26, 27 is automatically adjustable by frequency band to reduce audible interference between the primary program and the secondary program as audibly detected by the rear seat passenger while minimizing a disturbance to the primary audio program audibly detectable at the front seat row 32. A disturbance to the primary audio program is any change to a volume, fade, balance, or tone setting that occurs in response to the selection of the enhanced rear seat entertainment operating mode. In the normal operating mode, the output sound power frequency spectrum of the rear speakers 26, 27 is NOT automatically adjustable by frequency band to reduce audible interference between the primary program and the secondary program as audibly detected by the rear seat passenger while minimizing a disturbance to the primary audio program audibly detectable at the front seat row 32.

As used herein, adjustment by frequency band means that the output sound power frequency spectrum is attenuated by unequal amounts in at least 2 frequency bands of the output sound power frequency spectrum. As such, turning the volume down (i.e., using volume, balance, or fader controls) by attenuating the output sound power frequency spectrum equally across the spectrum would not be adjustment by frequency band. In an example of adjustment by frequency band as disclosed herein, the output sound power frequency spectrum of the rear speakers 26, 27 may have the output sound power in the bass frequency band 67 (i.e., low bass 70 to upper bass 72) reduced by 20 dB; the midrange frequency band 68 (i.e., lower midrange 73 to upper midrange 75) reduced by 10 dB; and the treble frequency band 69 (i.e., lower treble 76 to upper treble 78) not reduced. The example described in this paragraph will reduce audible interference between the primary program and the secondary program as audibly detected by the rear seat passenger wearing a headphone set 40 having a headphone attenuation curve 60 as depicted in FIG. 2A. Since the output sound power frequency spectrum of the rear speakers 26, 27 in the treble frequency band 69 is not reduced in the example, the disturbance to the primary audio program audibly detectable at the front seat row 32 is reduced or minimized. For comparison, if the rear speakers 26, 27 were completely muted, (i.e., not adjusted by frequency band) the disturbance to the primary audio program audibly detectable at the front seat row 32 would not be minimized. For further comparison, if the rear speakers 26, 27 are turned down equally across the output sound power frequency spectrum, the audible interference between the primary program and the secondary program as audibly detected by the rear seat passenger may be greater than (i.e., not as good as) the audible interference would be if the frequency band adjustment of the present disclosure had been used.

Examples of the present disclosure are not limited to headphone sets 40 having characteristics described in FIG. 2A. For example, a headphone set 40 may have better or worse attenuation in the midrange frequency band 68. Further, the automatic adjustment by frequency band disclosed herein may be applied with narrower or wider frequency bands than the bass 67, midrange 68, and treble 69 bands depicted in FIG. 2A. In an example of the present disclosure, the output sound power frequency spectrum of the rear speakers 26, 27 may be automatically adjustable by the frequency bands 65 depicted in FIG. 2B, with each of the frequency bands 65 having a different adjustment.

In examples of the present disclosure, a connection of the headphone set 40 to the secondary audio entertainment source 16 may automatically select the enhanced rear seat entertainment operating mode. The connection of the headphone set 40 to the secondary audio entertainment source 16 may be detectable by the audio entertainment system 10. As disclosed herein, such detection may be accomplished automatically. For example, after the headphone plug 42 is plugged into the audio jack 41, the connection may be automatically detectable by the audio entertainment system 10. Similarly, disconnection of the headphone 40 from the secondary audio entertainment source 16 may be detectable by the audio entertainment system 10.

Figure 7:
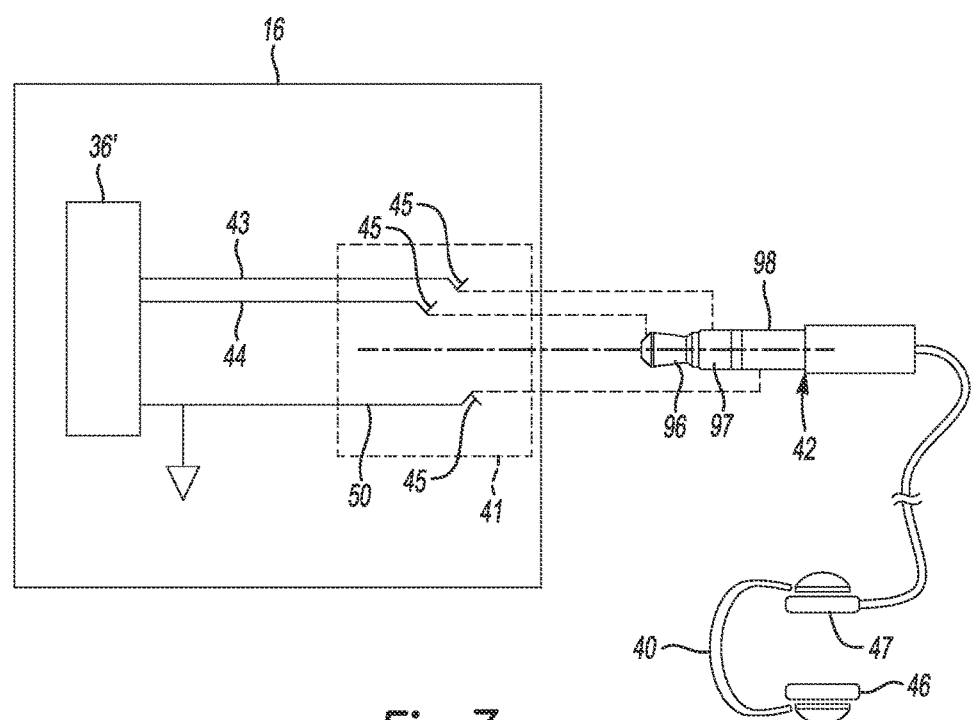
FIG. 7 is an electrical schematic diagram depicting an example of circuits of a wired headphone and a secondary audio entertainment source according to the present disclosure.

The audio jack 41 may have contacts 45 for connection to a left secondary channel 43 and a right secondary channel 44 connected to a secondary audio amplifier 36' to provide stereophonic audio capability connectable to the headphone 40. (See FIG. 7.) As shown in FIG. 7, the audio jack 41 may also have a ground circuit 50. As such, the left secondary channel 43 may carry a left portion of the secondary audio program for playing on a left side 46 of the headphone set 40. Similarly, the right secondary channel 44 may carry a right portion of the secondary audio program for playing on a right side 47 of the headphone set 40. It is understood that some headphone sets 40 may be made with sufficient symmetry that the headphone set 40 may be worn backwards. In other words, the left side 46 of the headphone set 40 may be worn on the right side of the listener's head. However, headphone sets 40 are generally labelled to allow the user to easily determine how to properly don the headphone set 40.

Examples of the present disclosure may include a wireless headphone set 40', wired headphone set 40, or combinations of both the wired headphone set 40 and the wireless 40' headphone set in the same vehicle 12. A wireless connection of wireless headphone set 40' may be detectable.

In an example of the present disclosure, a wireless headphone 40' may communicate using short-range wireless communication protocol that may include, for example, an optical communication protocol, or Bluetooth®. In an example with a Bluetooth® headphone set 40', a communication link may be established with the secondary audio entertainment source 16 to play the secondary audio program.

As disclosed herein, the audio entertainment system 10 may include a mode switch 38. The mode switch 38 may be manually accessible by the rear seat passenger while the rear seat passenger is seated in a rear seat 33. The enhanced rear seat entertainment operating mode is selectable by manipulating the mode switch 38. An audio amplifier 36 may be electrically connectable to the left rear speaker 26 or the right rear speaker 27 via a rear speaker audio circuit 28. (See FIG. 8.)

Figure 8:
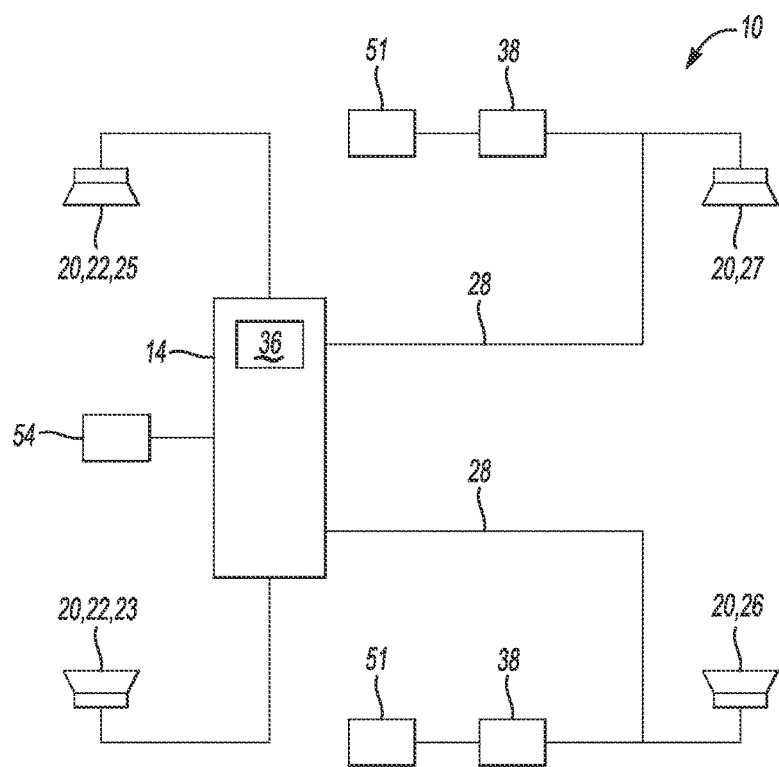
FIG. 8 is a block diagram depicting an example of circuits of the audio entertainment system as disclosed herein.

As depicted in FIG. 8, a passive electronic element 51 may be electrically connectable to the rear speaker audio circuit 28 via the mode switch 38. As used herein, a passive electronic element 51 means a resistor, capacitor, inductor or memristor. The mode switch 38 may be a momentary switch or a latching switch. The mode switch 38 may be activated by a real button, toggle, or knob; or by a virtual button on a touchscreen. A change in a voltage-current phase or voltage-current ratio from the passive electronic element 51 being connected to the rear speaker audio circuit 28 may be detectable by the audio amplifier 36.

Figure 9:
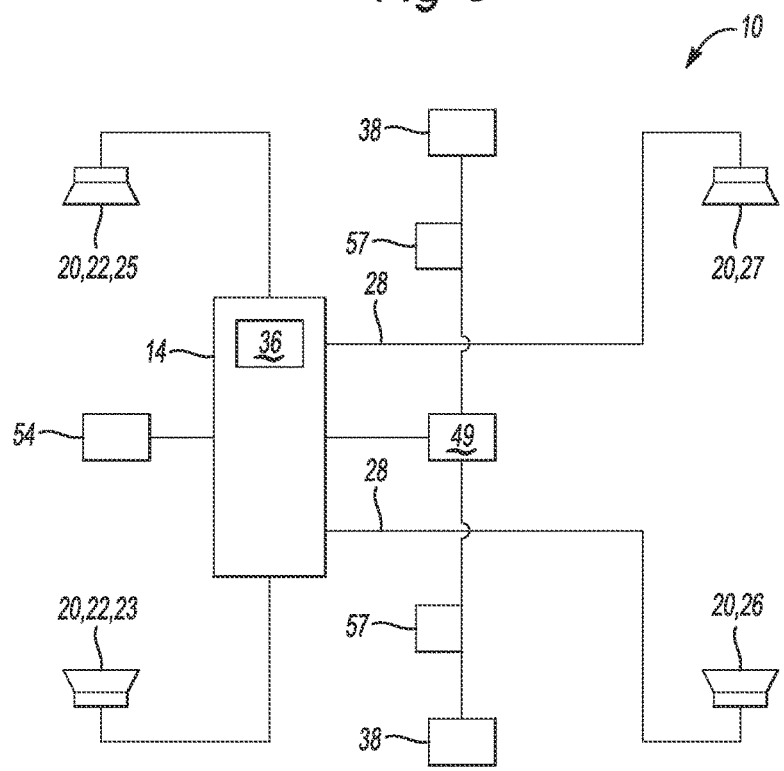
FIG. 9 is a block diagram depicting another example of circuits of the audio entertainment system as disclosed herein.

As depicted in FIG. 9, in examples of the present disclosure, the audio entertainment system 10 may further include an electronic communication network 49. For example, the electronic communication network 49 may be, for example, a LIN (Local Interconnect Network), LAN (Local Area Network), CAN (Controller Area Network), FlexRay (ISO 17458-1 to 17458-5), MOST (Media Oriented Systems Transport), etc. A state of the mode switch 38 may be detectable by a network transceiver 57 connected to the electronic communication network 49. The network transceiver 57 may send a signal to the audio entertainment system 10 to select the enhanced rear seat entertainment operating mode.

As depicted in FIGS. 3-6, examples of the present disclosure may include a master control switch 54 to selectably disable the enhanced rear seat entertainment operating mode. The master control switch 54 allows the driver to override the mode switch 38 and selectably disable the automatic adjustability of the output sound power frequency spectrum of the rear speakers 26, 27 by selectably disabling the enhanced rear seat entertainment operating mode. A mixer 55 may be included to downmix left and right channels of the primary audio program when the audio entertainment system 10 is in the enhanced rear seat entertainment operating mode and the primary audio program meets a selection criterion. The selection criterion may, for example, be a detectable programming format. An example of a detectable programming format is "talk radio". The format may be detectable by electronic analysis of the audio signal, or by other information associated with the audio signal. The selection criterion may be a characteristic broadcast or stored in metadata along with the primary audio program. For example, ID3, XM (Satellite Radio), PTY (Program Type) and HD Radio tags may identify a programming format. ID3 is a metadata container most often used in conjunction with the MP3 audio file format. HD Radio is a trademarked term for iBiquity's in-band on-channel (IBOC) digital radio technology.

In an example, if the primary audio program is talk radio, downmixing may be done without significantly changing the psychoacoustic image of the primary audio program. It is recognized however, that in high definition AM radio, some loss of fidelity may occur as a result of downmixing. For example, certain sponsor advertising segments, i.e., commercials, broadcast realistic car horn sounds that are predominately on the left or the right channel. Downmixing would tend to move the car horn sound from predominately in one channel to both channels. As disclosed herein, the master control switch 54 may be used to override the mode switch 38 and selectably disable the enhanced rear seat entertainment operating mode thereby selectably preventing the automatic downmixing of the primary audio program.

Figure 5:
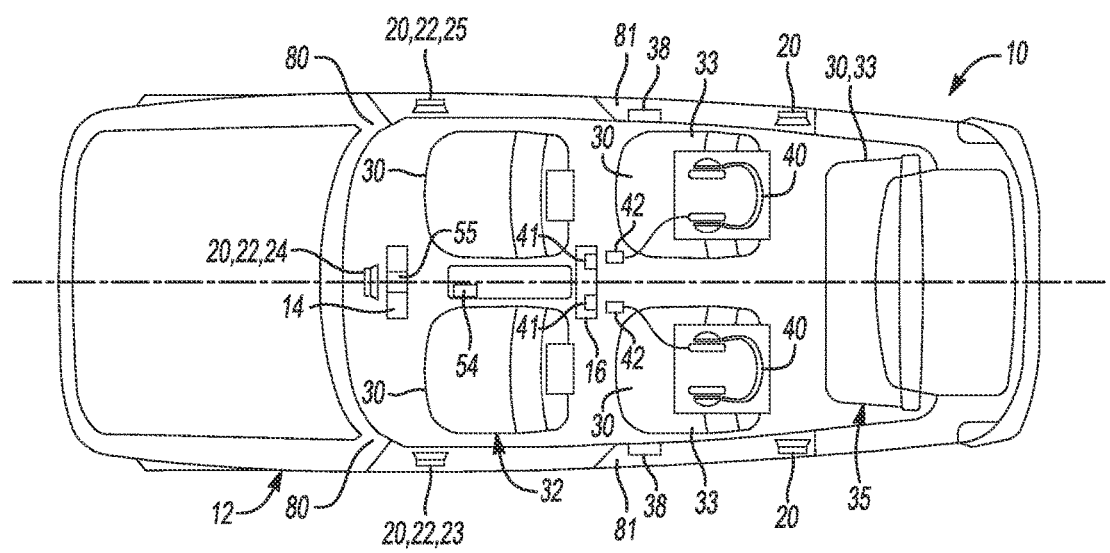
FIG. 5 is a semi-schematic overhead view depicting the example of the audio entertainment system for a vehicle depicted in FIG. 3 except two headphones are connected in the second row of seats according to the present disclosure.
Figure 6:
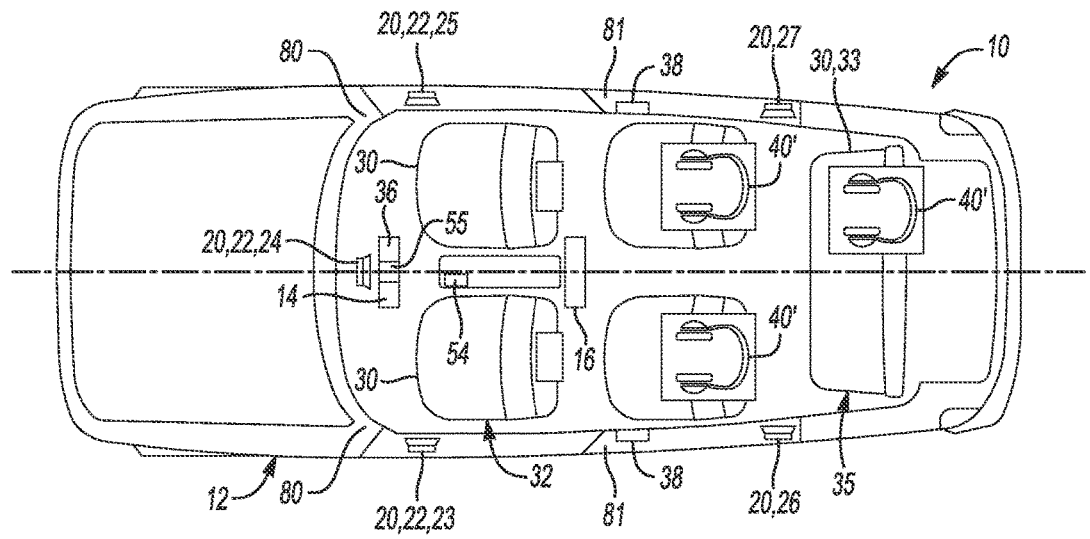
FIG. 6 is a semi-schematic overhead view depicting the example of the audio entertainment system for a vehicle depicted in FIG. 3 except two headphones are connected in the second row of seats and one headphone is connected in the third row of seats according to the present disclosure.

As depicted in FIGS. 5 and 6, another headphone set 40 for private listening by another rear seat passenger to the secondary audio program is shown, wherein the other headphone set 40 is selectably connectable to the secondary audio entertainment source 16. The audio entertainment system may have a selectable multiple enhanced rear seat entertainment operating mode. In the multiple enhanced rear seat entertainment operating mode, the output sound power frequency spectrum of the rear speakers 26, 27 is automatically adjustable by frequency band to reduce audible interference between the primary program and the secondary program as audibly detected by the rear seat passenger and the other rear seat passenger while minimizing a disturbance to the primary audio program audibly detectable at the front seat row 32.

In examples of the present disclosure, the output sound power of the headphone set 40 may be automatically adjustable in response to the output sound power of the plurality of front speakers 22. For example, if the vehicle 12 is traveling on a gravel road, the driver may offset increased noise from the gravel impinging on the vehicle body by increasing the volume of the program playing through the front speakers 22. Such an increase in volume of the front speakers 22 may deleteriously influence a rear seat passenger's enjoyment of a secondary audio program via the headphone set 40. As disclosed herein, the output sound power of the headphone set 40 may be automatically increased in response to the output sound power of the plurality of front speakers 22. Similarly, if the vehicle 12 transitions from a noisy road to a quiet road, the driver may reduce the volume of the program playing through the front speakers 22. As disclosed herein, the output sound power of the headphone set 40 may be automatically decreased in response to the output sound power of the plurality of front speakers 22. It is to be understood that although a manual change in volume of the front speakers 22 has been described, the audio entertainment system 10 may have an automatic volume control (AVC) system to automatically adjust the volume of the front speakers 22. The output sound power of the headphone set 40 may be automatically adjustable in response to the AVC output sound power of the plurality of front speakers 22.

It is to be understood that the ranges provided herein include the stated range and any value or sub-range within the stated range. For example, a range from about 160 Hz to about 320 Hz should be interpreted to include not only the explicitly recited limits of about 160 Hz and about 320 Hz, but also to include individual values, such as 180 Hz, 283 Hz, etc., and sub-ranges, such as from about 165 Hz to about 300 Hz, etc. Furthermore, when "about" is utilized to describe a value, this is meant to encompass minor variations (up to +/−10%) from the stated value.

In describing and claiming the examples disclosed herein, the singular forms "a", "an", and "the" include plural referents unless the context clearly dictates otherwise.

It is to be understood that the terms "connect/connected/connection" and/or the like are broadly defined herein to encompass a variety of divergent connected arrangements and assembly techniques. These arrangements and techniques include, but are not limited to (1) the direct communication between one component and another component with no intervening components therebetween; and (2) the communication of one component and another component with one or more components therebetween, provided that the one component being "connected to" the other component is somehow in operative communication with the other component (notwithstanding the presence of one or more additional components therebetween).

Furthermore, reference throughout the specification to "one example", "another example", "an example", and so forth, means that a particular element (e.g., feature, structure, and/or characteristic) described in connection with the example is included in at least one example described herein, and may or may not be present in other examples. In addition, it is to be understood that the described elements for any example may be combined in any suitable manner in the various examples unless the context clearly dictates otherwise.

While several examples have been described in detail, it is to be understood that the disclosed examples may be modified. Therefore, the foregoing description is to be considered non-limiting.

What is claimed is:

1. An audio entertainment system for a vehicle, comprising:
   a primary audio entertainment source to play a primary audio program and a secondary audio entertainment source to play a secondary audio program different from the primary audio program;
   a plurality of front speakers;
   a left rear speaker located aft and to the left of a front seat row;
   a right rear speaker located aft and to the right of the front seat row;
   a headphone set for private listening by a rear seat passenger to the secondary audio program wherein the headphone set is selectably connectable to the secondary audio entertainment source; and
   a device to automatically adjust an output sound power frequency spectrum of the rear speakers by frequency band;
   wherein:
      an output sound power of the headphone set is automatically adjustable in response to an output sound power of the plurality of front speakers;
      the audio entertainment system has a normal operating mode and a selectable enhanced rear seat entertainment operating mode; and
      in the selectable enhanced rear seat entertainment operating mode, the output sound power frequency spectrum of the rear speakers is automatically adjustable by the device by frequency band to reduce an audible interference between the primary program and the secondary program as audibly detected by the rear seat passenger while minimizing a disturbance to the primary audio program audibly detectable at the front seat row.

2. The audio entertainment system as defined in claim 1 wherein a connection of the headphone set to the secondary audio entertainment source automatically selects the enhanced rear seat entertainment operating mode.

3. An audio entertainment system for a vehicle, comprising:
   a primary audio entertainment source to play a primary audio program and a secondary audio entertainment source to play a secondary audio program different from the primary audio program;
   a plurality of front speakers;
   a left rear speaker located aft and to the left of a front seat row;
   a right rear speaker located aft and to the right of the front seat row;
   a headphone set for private listening by a rear seat passenger to the secondary audio program wherein the headphone set is selectably connectable to the secondary audio entertainment source;
   a device to automatically adjust an output sound power frequency spectrum of the rear speakers by frequency band; and
   a mode switch, the mode switch being manually accessible by the rear seat passenger while the rear seat passenger is seated in a rear seat;
   wherein:
      the audio entertainment system has a normal operating mode and a selectable enhanced rear seat entertainment operating mode;
      wherein the selectable enhanced rear seat entertainment operating mode is selectable by manipulating the mode switch; and
      in the selectable enhanced rear seat entertainment operating mode, the output sound power frequency spectrum of the rear speakers is automatically adjustable by the device by frequency band to reduce an audible interference between the primary program and the secondary program as audibly detected by the rear seat passenger while minimizing a disturbance to the primary audio program audibly detectable at the front seat row.

4. The audio entertainment system as defined in claim 3, further comprising:
   an audio amplifier electrically connectable to the left rear speaker or the right rear speaker via a rear speaker audio circuit; and
   a passive electronic element electrically connectable to the rear speaker audio circuit via the mode switch wherein:
      the mode switch is a momentary switch or a latching switch; and
      a change in a voltage-current phase or voltage-current ratio from the passive electronic element being connected to the rear speaker audio circuit is detectable by the audio amplifier.

5. The audio entertainment system as defined in claim 3, further comprising an electronic communication network wherein:
   a state of the mode switch is detectable by a network transceiver; and the network transceiver sends a signal to the audio entertainment system to select the selectable enhanced rear seat entertainment operating mode.

6. An audio entertainment system for a vehicle, comprising:
a primary audio entertainment source to play a primary audio program and a secondary audio entertainment source to play a secondary audio program different from the primary audio program;
a plurality of front speakers;
a left rear speaker located aft and to the left of a front seat row;
a right rear speaker located aft and to the right of the front seat row;
a headphone set for private listening by a rear seat passenger to the secondary audio program wherein the headphone set is selectably connectable to the secondary audio entertainment source;
a device to automatically adjust an output sound power frequency spectrum of the rear speakers by frequency band; and
a master control switch to selectably disable a selectable enhanced rear seat entertainment operating mode;
wherein:
the audio entertainment system has a normal operating mode and the selectable enhanced rear seat entertainment operating mode; and
in the selectable enhanced rear seat entertainment operating mode, the output sound power frequency spectrum of the rear speakers is automatically adjustable by the device by frequency band to reduce an audible interference between the primary program and the secondary program as audibly detected by the rear seat passenger while minimizing a disturbance to the primary audio program audibly detectable at the front seat row.

7. An audio entertainment system for a vehicle, comprising:
a primary audio entertainment source to play a primary audio program and a secondary audio entertainment source to play a secondary audio program different from the primary audio program;
a plurality of front speakers;
a left rear speaker located aft and to the left of a front seat row;
a right rear speaker located aft and to the right of the front seat row;
a headphone set for private listening by a rear seat passenger to the secondary audio program wherein the headphone set is selectably connectable to the secondary audio entertainment source;
a device to automatically adjust an output sound power frequency spectrum of the rear speakers by frequency band; and
a mixer to downmix left and right channels of the primary audio program when the audio entertainment system is in a selectable enhanced rear seat entertainment operating mode and the primary audio program meets a selection criterion;
wherein:
the audio entertainment system has a normal operating mode and the selectable enhanced rear seat entertainment operating mode; and
in the selectable enhanced rear seat entertainment operating mode, the output sound power frequency spectrum of the rear speakers is automatically adjustable by the device by frequency band to reduce an audible interference between the primary program and the secondary program as audibly detected by the rear seat passenger while minimizing a disturbance to the primary audio program audibly detectable at the front seat row.

8. The audio entertainment system as defined in claim 7 wherein the selection criterion is a detectable programming format.

9. The audio entertainment system as defined in claim 7 wherein the selection criterion is a characteristic broadcast or stored in metadata along with the primary audio program.

10. An audio entertainment system for a vehicle, comprising:
a primary audio entertainment source to play a primary audio program and a secondary audio entertainment source to play a secondary audio program different from the primary audio program;
a plurality of front speakers;
a left rear speaker located aft and to the left of a front seat row;
a right rear speaker located aft and to the right of the front seat row;
a headphone set for private listening by a rear seat passenger to the secondary audio program wherein the headphone set is selectably connectable to the secondary audio entertainment source;
an other headphone set for private listening by an other rear seat passenger to the secondary audio program wherein the other headphone set is selectably connectable to the secondary audio entertainment source; and
a device to automatically adjust an output sound power frequency spectrum of the rear speakers by frequency band;
wherein:
the audio entertainment system has a normal operating mode and a selectable enhanced rear seat entertainment operating mode;
the audio entertainment system has a selectable multiple enhanced rear seat entertainment operating mode;
in the selectable enhanced rear seat entertainment operating mode, the output sound power frequency spectrum of the rear speakers is automatically adjustable by the device by frequency band to reduce an audible interference between the primary program and the secondary program as audibly detected by the rear seat passenger while minimizing a disturbance to the primary audio program audibly detectable at the front seat row; and
in the selectable multiple enhanced rear seat entertainment operating mode, the output sound power frequency spectrum of the rear speakers is automatically adjustable by the device by frequency band to reduce the audible interference between the primary program and the secondary program as audibly detected by the rear seat passenger and the other rear seat passenger while minimizing the disturbance to the primary audio program audibly detectable at the front seat row.

11. A vehicle having an audio entertainment system, wherein the audio entertainment system includes:
a primary audio entertainment source to play a primary audio program and a secondary audio entertainment source to play a secondary audio program different from the primary audio program;
a plurality of front speakers;

a left rear speaker located aft and to the left of a front seat row;

a right rear speaker located aft and to the right of the front seat row;

a headphone set for private listening by a rear seat passenger to the secondary audio program;

a device to automatically adjust an output sound power frequency spectrum of the rear speakers by frequency band; and a switch, the switch being manually accessible by the rear seat passenger while the rear seat passenger is seated in a rear seat;

wherein:
- the headphone set is selectably connectable to the secondary audio entertainment source;
- the audio entertainment system has a normal operating mode and a selectable enhanced rear seat entertainment operating mode;
- the selectable enhanced rear seat entertainment operating mode is selectable by manipulating the switch; and
- in the selectable enhanced rear seat entertainment operating mode, the output sound power frequency spectrum of the rear speakers is automatically adjustable by the device by frequency band to reduce an audible interference between the primary program and the secondary program as audibly detectable by the rear seat passenger while minimizing a disturbance to the primary audio program audibly detectable at the front seat row.

12. The vehicle as defined in claim 11 wherein the audio entertainment system further includes:

an audio amplifier electrically connectable to the left rear speaker or the right rear speaker via a rear speaker audio circuit; and a passive electronic element electrically connectable to the rear speaker audio circuit via the switch wherein:
- the switch is a momentary switch or a latching switch; and
- a change in a voltage-current phase or voltage-current ratio from the passive electronic element being connected to the rear speaker audio circuit is detectable by the audio amplifier.

13. The vehicle as defined in claim 11 wherein:

the audio entertainment system further includes an electronic communication network;

a state of the switch is detectable by a network transceiver; and the network transceiver sends a signal to the audio entertainment system to select the selectable enhanced rear seat entertainment operating mode.

14. The vehicle as defined in claim 11 wherein the audio entertainment system further includes a master control switch to selectably disable the selectable enhanced rear seat entertainment operating mode.

15. The vehicle as defined in claim 11 wherein the audio entertainment system further includes a mixer to downmix left and right channels of the primary audio program when the audio entertainment system is in the selectable enhanced rear seat entertainment operating mode and the primary audio program meets a selection criterion.

16. The vehicle as defined in claim 11 wherein:

the audio entertainment system further includes an other headphone set for private listening by an other rear seat passenger to the secondary audio program;

the other headphone set is selectably connectable to the secondary audio entertainment source;

the audio entertainment system has a selectable multiple enhanced rear seat entertainment operating mode; and in the selectable multiple enhanced rear seat entertainment operating mode, the output sound power frequency spectrum of the rear speakers is automatically adjustable by the device by frequency band to reduce audible interference between the primary program and the secondary program as audibly detected by the rear seat passenger and the other rear seat passenger while minimizing the disturbance to the primary audio program audibly detectable at the front seat row.

17. The vehicle as defined in claim 11 wherein an output sound power of the headphone set is automatically adjustable in response to an output sound power of the plurality of front speakers.

* * * * *